US012603587B2

(12) United States Patent
Jang et al.

(10) Patent No.: US 12,603,587 B2
(45) Date of Patent: Apr. 14, 2026

(54) PIEZOELECTRIC ELEMENT AND METHOD FOR MANUFACTURING PIEZOELECTRIC ELEMENT

(71) Applicant: DAEGU GYEONGBUK INSTITUTE OF SCIENCE AND TECHNOLOGY, Daegu (KR)

(72) Inventors: Kyung In Jang, Incheon (KR); Ho Hyun Keum, Seoul (KR); Jun Woo Yea, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 1046 days.

(21) Appl. No.: 17/765,056

(22) PCT Filed: Oct. 21, 2019

(86) PCT No.: PCT/KR2019/013803
§ 371 (c)(1),
(2) Date: May 4, 2022

(87) PCT Pub. No.: WO2021/066241
PCT Pub. Date: Apr. 8, 2021

(65) Prior Publication Data
US 2022/0399835 A1 Dec. 15, 2022

(30) Foreign Application Priority Data

Oct. 2, 2019 (KR) ........................ 10-2019-0122506

(51) Int. Cl.
*H02N 2/18* (2006.01)
*H02N 2/00* (2006.01)
(Continued)

(52) U.S. Cl.
CPC ............... *H02N 2/186* (2013.01); *H02N 2/22* (2013.01); *H10N 30/05* (2023.02);
(Continued)

(58) Field of Classification Search
CPC ...... H10N 30/87; H10N 30/883; H10N 30/05; H10N 30/063; H10N 30/871; H10N 30/20;
(Continued)

(56) References Cited

U.S. PATENT DOCUMENTS 3,816,774 A * 6/1974 Ohnuki ................. B06B 1/0688
310/369
4,056,742 A * 11/1977 Tibbetts ............... H10N 30/204
310/357
(Continued)

FOREIGN PATENT DOCUMENTS

EP 2439000 A1 * 4/2012 ............... B06B 1/06
JP 2002-343209 11/2002
JP 2006-332616 12/2006
KR 10-1658308 9/2016

OTHER PUBLICATIONS

KIPO, Notice of Allowance of KR 10-2019-0122506 dated Feb. 18, 2022.
(Continued)

*Primary Examiner* — J. San Martin
(74) *Attorney, Agent, or Firm* — LEX IP MEISTER, PLLC

(57) ABSTRACT

The disclosure provides a piezoelectric element and a method for manufacturing a piezoelectric element. The disclosure provides the piezoelectric element comprising: a base layer, a piezoelectric layer which is disposed on one surface of the base layer, and in which upwardly curved convex portions and downwardly curved concave portions are continuously disposed along a first direction; and contact
(Continued)

members which are disposed on the concave portions of the piezoelectric layer and on the one surface of the base layer to connect the piezoelectric layer to the base layer.

15 Claims, 8 Drawing Sheets

(51) Int. Cl.

| | | |
|---|---|---|
| *H10N 30/05* | (2023.01) | |
| *H10N 30/063* | (2023.01) | |
| *H10N 30/50* | (2023.01) | |
| *H10N 30/87* | (2023.01) | |
| *H10N 30/88* | (2023.01) | |

(52) U.S. Cl.
CPC ........... *H10N 30/063* (2023.02); *H10N 30/50* (2023.02); *H10N 30/871* (2023.02); *H10N 30/875* (2023.02); *H10N 30/883* (2023.02)

(58) Field of Classification Search
CPC ........ H10N 30/875; H10N 30/50; H02N 2/22; H02N 2/02; H02N 2/028; H02N 2/186
See application file for complete search history.

(56) References Cited

U.S. PATENT DOCUMENTS

| | | | |
|---|---|---|---|
| 6,107,726 | A | 8/2000 | Near et al. |
| 6,958,567 | B2 * | 10/2005 | Fuller ................... B32B 15/082 |
| | | | 310/326 |
| 7,793,394 | B2 | 9/2010 | Sugahara |
| 8,379,888 | B2 * | 2/2013 | Lee ......................... H04R 17/00 |
| | | | 381/116 |
| 8,406,438 | B2 * | 3/2013 | Ihl .......................... H04R 17/00 |
| | | | 310/326 |
| 9,832,572 | B2 * | 11/2017 | Gerlach ............... H04R 17/005 |
| 2006/0107726 | A1 | 5/2006 | Heggemann et al. |
| 2007/0184238 | A1 * | 8/2007 | Hockaday ........... F04B 39/1073 |
| | | | 428/98 |
| 2011/0309716 | A1 * | 12/2011 | Jenninger ............. B32B 27/285 |
| | | | 156/92 |
| 2015/0298173 | A1 | 10/2015 | Bibl et al. |
| 2016/0156287 | A1 * | 6/2016 | Yang .................... H10N 30/306 |
| | | | 310/339 |

OTHER PUBLICATIONS

KIPO, Office Action of KR 10-2019-0122506 dated Jun. 22, 2021.
KIPO, PCT Search Report & Written Opinion of PCT/KR2019/013803 dated Jul. 1, 2020.

* cited by examiner

PIEZOELECTRIC ELEMENT AND METHOD FOR MANUFACTURING PIEZOELECTRIC ELEMENT

TECHNICAL FIELD

This disclosure relates to a piezoelectric element and a manufacturing method of the piezoelectric element.

BACKGROUND ART

Energy harvesting refers to a technology for converting energy generated from a natural energy source into electrical energy such as sunlight, vibration, heat, wind, and the like. Since the energy harvesting may obtain direct electrical energy in nature, the energy harvesting technology gains spotlight as eco-friendly energy utilization technology as to stability, security, and sustainability of the energy supply are excellent and may reduce environmental pollution.

The energy harvesting may be classified as chemical energy harvesting, optical energy harvesting and mechanical energy harvesting, depending on which energy source is used, and the mechanical energy harvesting includes energy harvesting using a piezoelectric element.

The piezoelectric element is an apparatus that uses a piezoelectric effect which is a phenomenon in which a voltage is generated when mechanical pressure is applied, and mechanical deformation occurs when a voltage is applied. However, there is a problem in that a conventional piezoelectric element cannot be applied to an environment where stretching or contraction is required, or the reliability and reproducibility of the element are not ensured.

The above-described background technology is technical information acquired by an inventor for deriving the disclosure, or acquired in the process of deriving the disclosure, so it cannot necessarily be called a known technology disclosed to the general public prior to the application of the disclosure.

DISCLOSURE

Technical Problem

The embodiments of the disclosure provide a piezoelectric element with improved energy harvesting efficiency and a manufacturing method of the piezoelectric element.

Means for Solving Problems

The piezoelectric element according to an embodiment includes a base layer, a piezoelectric layer which is disposed on one surface of the base layer, and in which upwardly curved convex portions and downwardly curved concave portions are continuously disposed along a first direction; and contact members which are disposed on the concave portions of the piezoelectric layer and on the one surface of the base layer to connect the piezoelectric layer to the base layer.

Effect of Invention

The piezoelectric element and the manufacturing method of the piezoelectric element according to an embodiment of the disclosure may minimize the offset of the generated electric energy by differently disposing electrodes according to the curvature of the piezoelectric layer. Since the piezoelectric layer is disposed to be stretched and contracted in two different directions, the density of electrical energy generated may be increased.

MODE FOR CARRYING OUT THE INVENTION

Figure 1A:
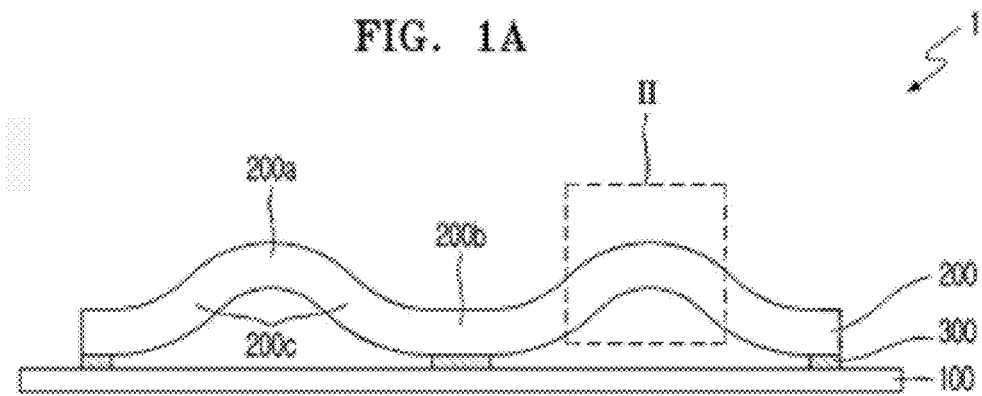
FIGS. 1A and 1B are diagrams illustrating a piezoelectric element according to an embodiment of the disclosure.

The piezoelectric element according to an embodiment includes a base layer, a piezoelectric layer which is disposed on one surface of the base layer, and in which upwardly curved convex portions and downwardly curved concave portions are continuously disposed along a first direction; and contact members which are disposed on the concave portions of the piezoelectric layer and on the one surface of the base layer to connect the piezoelectric layer to the base layer.

According to an embodiment, the piezoelectric layer may include a first electrode disposed adjacent to the base layer, and having a first(a) electrode terminal and a first(b) electrode terminal disposed to be spaced apart from each other; a second electrode comprising a second(a) electrode terminal of which a portion overlaps the first(a) electrode terminal and a second(b) electrode terminal of which a portion overlaps the first(b) electrode terminal; and a piezoelectric body disposed between the first electrode terminal and the second electrode terminal.

According to an embodiment, the first electrode may include the first(a) electrode terminal being disposed at an area corresponding to the convex portions and the first(b) electrode terminal being disposed at both ends of the first(a) electrode terminal.

According to an embodiment, an area of the first(a) electrode terminal may be greater than an area of the first(b) electrode terminal.

According to an embodiment, the second electrode may include the second(a) electrode terminal being disposed at an area corresponding to the convex portions and the second(b) electrode terminal being disposed at both ends of the second(a) electrode terminal.

According to an embodiment, an area of the second(a) electrode terminal may be greater than an area of the second(b) electrode terminal.

According to an embodiment, a distance between the first(a) electrode terminal and the first(b) electrode terminal may be smaller than a distance between the second(a) electrode terminal and the second(b) electrode terminal.

According to an embodiment, a curvature of the first(a) electrode terminal may be greater than a curvature of the first(b) electrode terminal, and a curvature of the second(a) electrode terminal may be greater than a curvature of the second(b) electrode terminal.

According to an embodiment, the piezoelectric layer may not be disposed with the first electrode and the second electrode at an area corresponding to the contact members.

According to an embodiment, wherein the piezoelectric element may further include a cover member which covers at least a portion of the piezoelectric element and fluid is filled therein.

According to an embodiment, the piezoelectric layer may have a first piezoelectric layer disposed in the first direction, and a second piezoelectric layer disposed in a second direction different from the first direction, and intersecting with the concave portions of the first piezoelectric layer.

According to an embodiment, the piezoelectric element may be stretchable or contractible in at least one of the first direction and the second direction.

According to an embodiment, the contact members may fix the concave portions of the first piezoelectric layer and the concave portions of the second piezoelectric layer to the base layer.

According to an embodiment, a manufacturing method of a piezoelectric element may include forming a piezoelectric layer having a first electrode, a second electrode, and a piezoelectric body; disposing contact members at a preset position of the piezoelectric layer; attaching the contact members to a base layer; and forming a curvature at the piezoelectric layer.

The method may further include applying a tensile force to the base layer before forming curvature in the piezoelectric layer, and the forming the curvature in the piezoelectric layer may include connecting the piezoelectric layer to the base layer by attaching the contact members to a surface of the base layer; and forming curvature in the piezoelectric layer by removing the tensile force applied to the base layer.

According to another embodiment, the forming curvature in the piezoelectric layer may include forming an area between the contact members to be upwardly convex in the piezoelectric layer.

According to another embodiment, the first electrode may include a first(a) electrode terminal and a first(b) electrode terminal disposed to be spaced apart from each other, and the second electrode may include a second(a) electrode terminal of which a portion overlaps the first(a) electrode terminal and a second(b) electrode terminal of which a portion overlaps the first(b) electrode terminal, and the forming the piezoelectric layer may include not disposing the first electrode and the second electrode in an area corresponding to the contact members.

According to another embodiment, The forming the piezoelectric layer may include forming the first electrode terminal(a) at a center of a first region corresponding between the contact members, and disposing a first(b) electrode terminal at both sides of the first(a) electrode terminal to be spaced apart from the first(a) electrode terminal.

According to another embodiment, the applying a tensile force to the base layer may include applying the tensile force in a first direction and a second direction, the forming the curvature in the piezoelectric layer may include disposing the first piezoelectric layer in the first direction and disposing the second piezoelectric layer in the second direction to be crossed with the first piezoelectric layer; and forming curvature may be formed in the first piezoelectric layer and the second piezoelectric layer by removing the tensile force applied in the first direction and the second direction.

According to another embodiment, a covering member for covering at least a portion of the piezoelectric element with a cover member by filling a fluid inside the piezoelectric element may be further included.

Other aspects, features, and advantages other than those described above will become apparent from the specific details, claims, and drawings for practicing the invention below.

Mode of Invention

The embodiment is directed to various embodiments and may have various embodiments, and will be described in detail with reference to the description of the embodiment. It should be understood, however, that this is not intended to be limited to the particular embodiments of the embodiment, and it is to be understood that all of the conversion, equivalents, and alternatives falling within the spirit and scope of the embodiment are included. Although the invention is illustrated in another embodiment, the same reference numeral used for the same component.

The terms first, second, etc. may be used to describe various components, but the components should not be limited by terms. The terms are used only to distinguish one component from another component.

In this disclosure, the terms "comprises" or "having" and the like are used to specify that there is a feature, number, step, operation, element, part or combination thereof described in the specification, but do not preclude the presence or addition of one or more other features, numbers, steps, operations, elements, parts, or combinations thereof.

The present invention will be described in detail with reference to embodiments of the disclosure shown in the accompanying drawings.

Figure 1B:
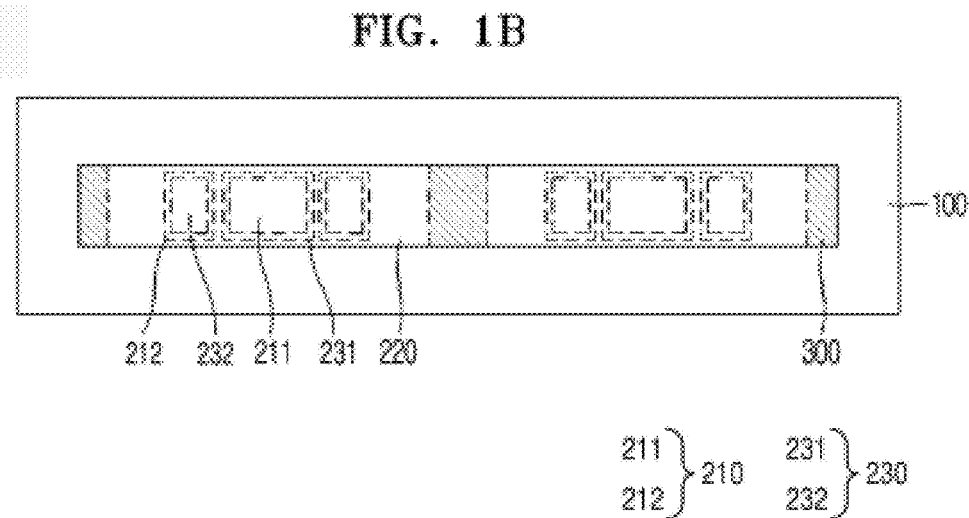
Figure 2:
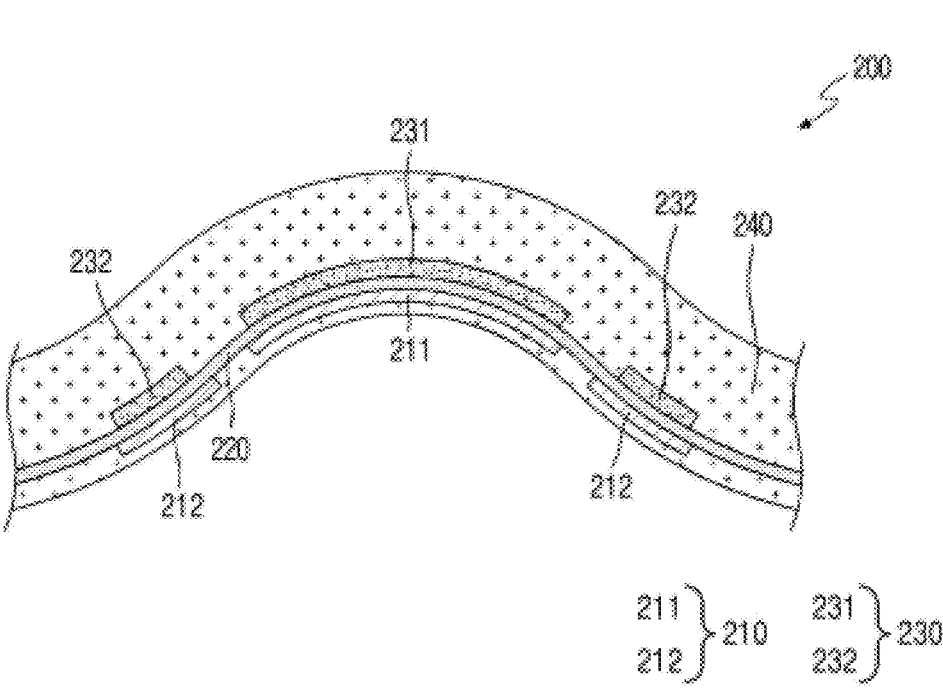
FIG. 2 is an enlarged cross-sectional view of portion II in FIG. 1A.

FIGS. 1A and 1B are diagrams illustrating the piezoelectric element 1 according to an embodiment of the disclosure; FIG. 1A is a front view of the piezoelectric element 1, and FIG. 1B is a plan view of the piezoelectric element 1 of FIG. 1A projecting some configurations; FIG. 2 is an enlarged cross-sectional view of portion II in FIG. 1A; and FIG. 3 is a diagram illustrating the piezoelectric layer 200 of FIGS. 1A and 1B in detail.

Referring to FIGS. 1A, 1B, 3A, 3B and 3C, the piezoelectric element 1 according to an embodiment includes a base layer 100, a piezoelectric layer 200 which is disposed on one surface of the base layer 100, and in which upwardly curved convex portions 200a and downwardly curved concave portions 200b are continuously disposed along a first direction; and contact members 300 which are disposed on the concave portions 200b of the piezoelectric layer 200 and on the one surface of the base layer 100 to connect the piezoelectric layer 200 to the base layer 100.

The base layer 100 is a plate-shaped member in which a different member of the piezoelectric element 1 is disposed. The base layer 100 may be an elastic body such that the piezoelectric element 1 may be stretched and contracted. For example, the base layer 100 may be formed of an elastic polymer, such as polyimide, polydimethylsiloxane (PDMS), or Ecoplex.

The piezoelectric layer 200 is a member for generating energy as an external force is applied to the piezoelectric element 1, and is disposed on one surface of the base layer 100. Although the shape of the piezoelectric layer 200 is not particularly limited, the shape of the piezoelectric layer 200 may be varied as the base layer 100 is stretched or contracted by an external force. In one embodiment of the disclosure, the piezoelectric layer 200 may be formed in a shape in which the convex portions 200a and the concave portions 200b are repeatedly disposed along one direction, and a connection portion 200c may be disposed therebetween.

Referring to FIGS. 1A and 1B and 2, the piezoelectric layer 200 may include a first electrode 210, a piezoelectric body 220, and a second electrode 230.

The first electrode 210 is disposed adjacent to the base layer 100. The first electrode 210 may be a thin plate-shaped metal plate. The material of the first electrode 210 is not particularly limited, and in one embodiment of the disclosure, the first electrode 210 may be formed of titanium (Ti) and platinum (Pt). For example, the first electrode 210 may be a shape in which platinum having a thickness around 200 nm is stacked on titanium having a thickness around 15 nm.

The second electrode 230 is spaced apart from the first electrode 210 in a height direction. The second electrode 230 may be a thin plate-shaped metal plate like the first electrode 210. The material of the second electrode 230 is not particularly limited, and in one embodiment, the second electrode 230 may be made of chromium (Cr) and gold (Au). For example, the second electrode 230 may be a shape in which metal having a thickness around 100 nm is stacked on chromium having a thickness around 10 nm.

Referring to FIG. 2, the curvature of the first electrode 210 may be greater than the curvature of the second electrode 230.

The piezoelectric body 220 is a material for generating electric charge while the internal electric dipole is aligned when the external force is received and may be disposed between the first electrode 210 and the second electrode 230. The piezoelectric body 220 is spaced apart from the neutral plane of the piezoelectric element 1. The piezoelectric body 220 may extend in the longitudinal direction of the piezoelectric element 1 and may be continuously disposed. Accordingly, when the piezoelectric element 1 is stretched or contracted by the external force, the piezoelectric body 220 of the piezoelectric layer 200 may also stretch or contract, thereby generating an electric charge, and the generated charge moves to the first electrode 210 and the second electrode 230. The material of the piezoelectric body 220 is not particularly limited, and a material that may generate a voltage when stress is applied can be used. For example, the piezoelectric layer 200 may be any one of a piezoelectric ceramic such as lead zirconate titanate (PZT), lithium niobate ($LiNbO_3$), or barium titanate ($BaTiO_3$) or a polymer material such as polyvinylidene fluoride (PVDF). In one embodiment of the disclosure, the piezoelectric body 220 may be a PZT having a thickness of around 1 μm.

The piezoelectric body 220 may go through a separate poling process such that an internal electric dipole is disposed in a predetermined direction. The piezoelectric element 1 according to an embodiment may perform a poling process to operate in a $d_{31}$ mode in which a voltage is generated in a height direction when stress is generated in the longitudinal direction of the piezoelectric layer 200. The poling process may be performed before laminating the piezoelectric body 220, or may be performed after the piezoelectric element 1 is manufactured.

When a curved portion is formed in the piezoelectric layer, such as the shape of the piezoelectric layer 200 according to an embodiment of the disclosure, stress in different directions may be applied to the curved portion and the adjacent portions of the curved portion. In this state, when the piezoelectric layer is stretched or contracted in the longitudinal direction, the piezoelectric material disposed in the curved portion and the piezoelectric material disposed in the adjacent portion may generate electric charges in different directions. For example, depending on the extension of the piezoelectric layer, the piezoelectric material disposed in the curved portion may generate a positive charge to the lower electrode, positive charge to the upper electrode, and the piezoelectric material disposed in the adjacent portion may cause a positive charge to the lower electrode to generate a negative charge to the upper electrode. Accordingly, different charges may coexist in one of the electrodes on the basis of the piezoelectric layer, and the charges may be offset from each other. Therefore, the total amount of energy generated according to the stretching and contraction of the piezoelectric element may be reduced.

The piezoelectric element 1 according to an embodiment of the disclosure may separate the first electrode 210 into a portion disposed on the convex portions 200a and a portion disposed on the connection portion 200c, and separate the second electrode 230 into a portion disposed on the convex portions 200a and a portion disposed on the connection portion 200c. A detailed configuration of the first electrode 210 and the second electrode 230 will be described with reference to FIGS. 3A, 3B, 3C.

Figure 3A:
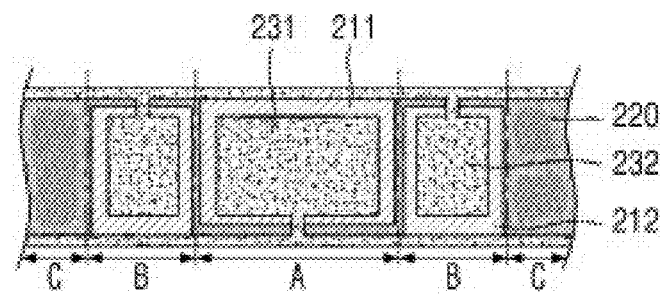
FIGS. 3A, 3B, 3C are diagrams illustrating the piezoelectric layer of FIGS. 1A and 1B in detail.
Figure 3B:
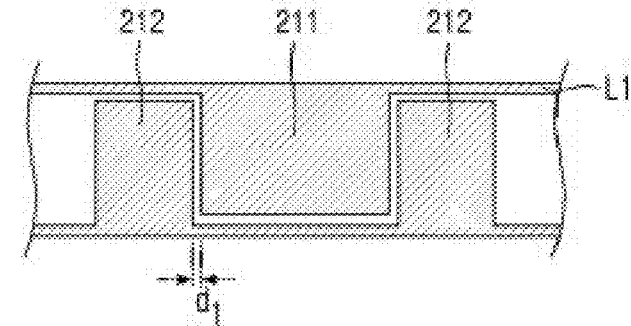

FIG. 3A is a plan view of the piezoelectric layer 200 in which the first electrode 210, the piezoelectric body 220, and the second electrode 230 are sequentially stacked, wherein area A corresponds to convex portions 200a, area B corresponds to connection portion 200c, and area C corresponds to the concave portions 200b. FIG. 3B is a plan view of the first electrode 210, and FIG. 3C is a plan view of the second electrode 230.

Figure 3C:
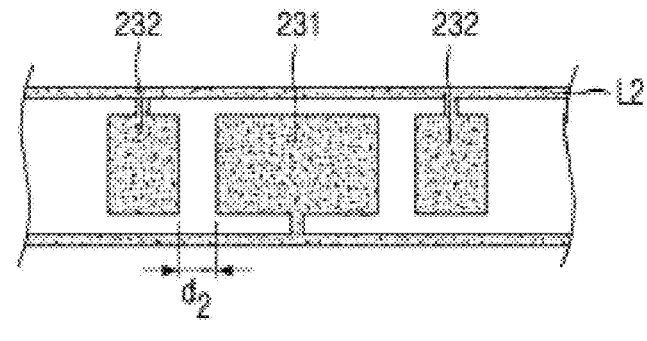

As shown in FIGS. 3A, 3B, 3C, the first electrode 210 may include a first (a) electrode terminal 211 and a first (b) electrode terminal 212. The first (a) electrode terminal 211 and the first (b) electrode terminals 212 may be spaced apart from each other by a distance $d_1$. The first (a) electrode terminal 211 may be disposed in a region corresponding to the convex portions 200a, and the first (b) electrode terminal 212 may be disposed on both sides of the first (a) electrode terminal 211. The first (b) electrode terminal 212 may be disposed in a region corresponding to the connection portion 200c. The area of the first (a) electrode terminal 211 may be larger than the area of one of the first (b) electrode terminals 212. Through such a configuration, when the electric charges are transferred from the piezoelectric body 220 to the first electrode 210 by the extension or contraction of the piezoelectric element 1, the charges do not offset each other even if different charges exist in the first (a) electrode terminal 211 and the first (b) electrode terminal 212, respectively.

As illustrated in FIG. 3, the second electrode 230 may include a second(a) electrode terminal 231 and a second(b) electrode terminal 232. The second(a) electrode terminal 231 and the second(b) electrode terminal 232 may be disposed to be spaced apart from each other by a distance $d_2$. Also, the second(a) electrode terminal 231 may be disposed in a region corresponding to the convex portions 200a, and the second(b) electrode terminal 232 may be disposed on both sides of the second(a) electrode terminal 231, respectively. The second(b) electrode terminal 232 may be disposed in a region corresponding to the connection portion 200c. The area of the second(a) electrode terminal 231 may be larger than the area of one of the second(b) electrode terminal 232. Through this configuration, when electric charges are transferred from the piezoelectric body 220 to the second electrode 230 by the extension or contraction of the piezoelectric element 1, even if different charges exist in the second(a) electrode terminal 231 and the second(b) electrode terminal 232, these charges do not offset each other.

Referring to FIGS. 3A, 3B, 3C, the area of the second (a) electrode terminal 231 and the second (b) electrode terminal 232 may be smaller than the area of the first (a) electrode terminal 211 and the first (b) electrode terminal 212, respectively. The distance $d_1$ between the first (a) electrode terminal 211 and the first (b) electrode terminal 212 may be greater than the interval $d_2$ between the second (a) electrode terminal 231 and the second (b) electrode terminal 232. In addition, at least a portion of the second (a) electrode terminal 231 and the second (b) electrode terminal 232 may overlap the first (a) electrode terminal 211 and the first (b) electrode terminal 212, respectively. Accordingly, it is possible to prevent the second electrode 230 from being in contact with the first electrode 210 to cause a short circuit.

Referring to FIGS. 3A, 3B, 3C, the charge generated from the first electrode 210 may move to the outside through the conductive line L1, and the charge generated from the second electrode 230 may move to the outside through the conductive line L2. The conductive line L1 and the conductive line L2 may be the same material as the first electrode 210 and the second electrode 230, respectively. The conductive line L1 may be divided into a portion connected to the first (a) electrode terminal 211 and a portion connected to the first (b) electrode terminal 212. The conductive line L2 may be divided into a portion connected to the second (a) electrode terminal 231 and a part connected to the second (b) electrode terminal 232. Through this configuration, the charge generated from the first electrode 210 and the second electrode 230 may move to the outside without being offset from each other. Accordingly, the energy generation efficiency of piezoelectric element 1 may be increased.

FIGS. 3A, 3B, 3C shows that the connection line (reference numeral not shown) is branched from the conductive line L2 and connected to the second electrode 230, but is not limited thereto. For example, as the first electrode 210 and the conductive line L1 illustrated in FIG. 3B, the second electrode 230 and the conductive line L2 may be directly connected.

Referring to FIGS. 1A and 1B, the contact members 300 may be disposed between the base layer 100 and the piezoelectric layer 200, to connect the base layer 100 and the piezoelectric layer 200. The contact members 300 may be disposed at a preset position. For example, the contact members 300 may be disposed between the concave portions 200b and one surface of the base layer 100 of the piezoelectric layer 200. Accordingly, the piezoelectric layer 200 may be fixed to the base layer 100 by the contact members 300 disposed at the side of the concave portions 200b, and may maintain the shape in which the convex portions 200a are disposed between the concave portions 200b. The position of the contact members 300 is not particularly limited, but it is preferable that the piezoelectric layer 200 is disposed in a position where a constant shape is maintained. Accordingly, it is possible to implement the piezoelectric element 1 having a three-dimensional structure having a constant wavelength and amplitude, and may secure the re-constitution and reliability of the three-dimensional structure formation. The material of the contact members 300 is not particularly limited, and may be Ti—SiO₂ formed by deposition according to an embodiment. The thickness of Ti may be around 10 nm, and the thickness of SiO₂ may be around 60 nm.

According to another embodiment, the first electrode 210 and the second electrode 230 may not be disposed in a region of the piezoelectric layer 200 corresponding to the contact members 300.

According to another embodiment, the piezoelectric layer 200 may further include a protective layer 240. The protective layer 240 protects the piezoelectric layer 200 from external impact by covering the piezoelectric layer 200 as a whole. The protective layer 240 may be an elastic polymer such as a polyimide. In one embodiment of the disclosure, the protective layer 240 may be a polyimide having a thickness around 1.5 μm.

Figure 4:
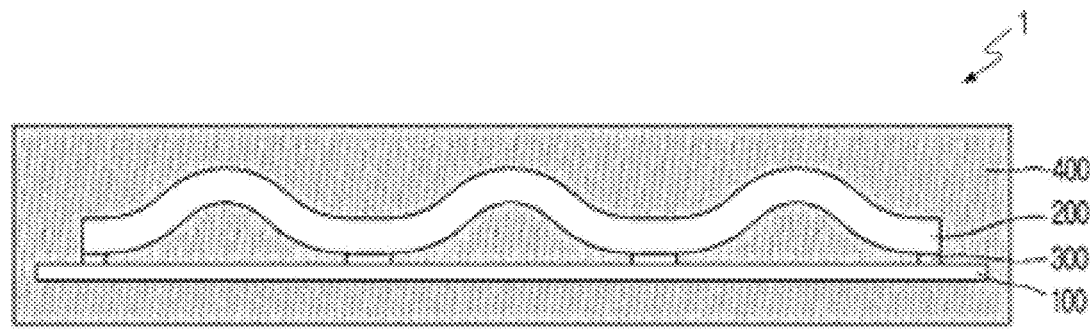
FIG. 4 is a diagram illustrating a piezoelectric element according to another embodiment of the disclosure.

According to another embodiment, the piezoelectric element 1 may further comprise a cover member 400. The cover member 400 may be an elastomer with a fluid filled inside. As shown in FIG. 4, the cover member 400 entirely covers the base layer 100, the piezoelectric layer 200, and the contact members 300. The type of fluid filled inside the cover member 400 is not particularly limited, and silicon polymer (Silicone oligomer) and the like may be used. The cover member 400 may protect the piezoelectric element 1 from external impact by covering the piezoelectric element 1 as a whole. By covering the piezoelectric layer 200 covered by the protective layer 240 once more with the cover member 400, the reliability of the entire piezoelectric element 1 may be further improved.

In another embodiment, the piezoelectric element 1 may be disposed so that the piezoelectric layer 200 intersects in two different directions.

Figure 5:
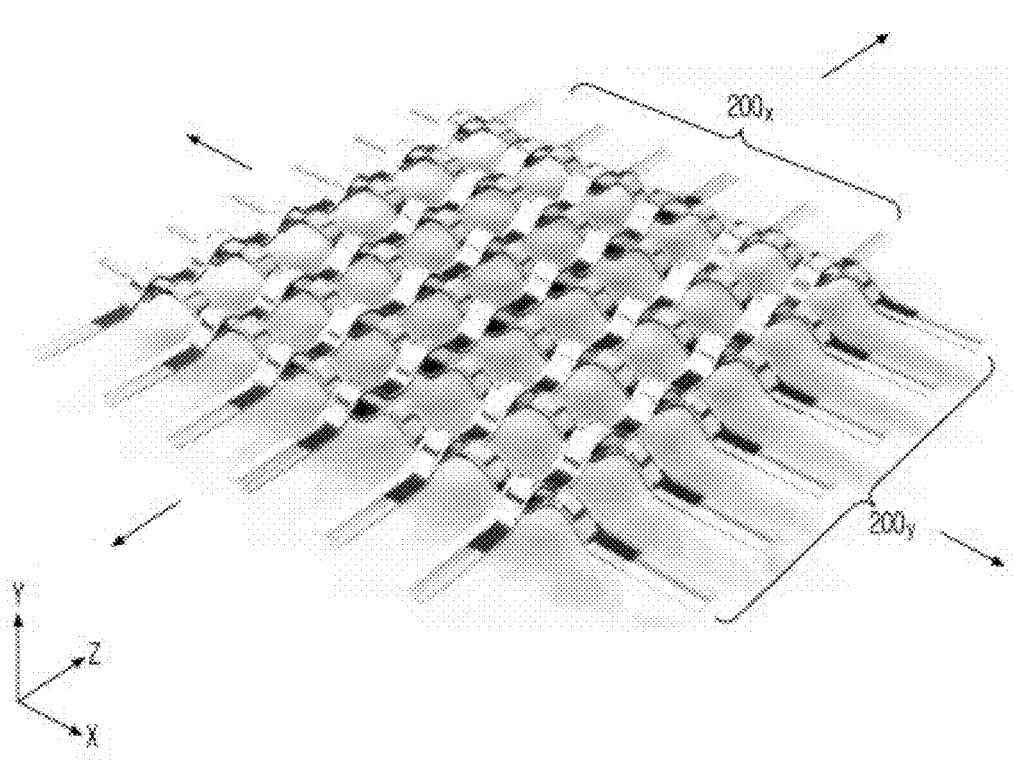
FIG. 5 is a diagram illustrating a piezoelectric element according to another embodiment of the disclosure.

Referring to FIG. 5, the piezoelectric layer 200 may include a first piezoelectric layer 200ₓ disposed in the first direction (e.g., the X-axis direction of FIG. 5) and a second piezoelectric layer 200ᵧ disposed in a second direction (e.g., the Y-axis direction of FIG. 5) different from the first direction. The first piezoelectric layer 200ₓ and the second piezoelectric layer 200ᵧ may be disposed so that the convex portions 200a and concave portions 200b intersect each other. For example, referring to FIG. 5, the convex portions 200a of the first piezoelectric layer 200ₓ may be disposed on the concave portions 200b of the second piezoelectric layer 200ᵧ, or conversely, convex portions 200a of the second piezoelectric layer 200ᵧ may be disposed on the concave portions 200b of the first piezoelectric layer 200ₓ. Here, the contact members 300 may be disposed on one side of the concave portions 200b of the first piezoelectric layer 200ₓ and the second piezoelectric layer 200ᵧ, and may fix the first piezoelectric layer 200ₓ and the second piezoelectric layer 200ᵧ may be fixed to the base layer 100.

Through this configuration, the first piezoelectric layer 200ₓ and the second piezoelectric layer 200ᵧ may be are stretched and contracted in two different directions (first direction and second direction) while being fixed to the base layer 100. In addition, by arranging the first piezoelectric layer 200ₓ and the second piezoelectric layer 200ᵧ to cross each other, the density of energy generated according to the extension and contraction of the piezoelectric element 1 may be increased.

By disposing a plurality of first piezoelectric layers 200ₓ in the first direction, and a plurality of second piezoelectric layers 200ᵧ in the second direction, the piezoelectric element 1 having a three-dimensional net structure may be implemented.

With this configuration, the density of energy generated by the stretching and contracting of piezoelectric element 1 may be further increased.

Figure 6:
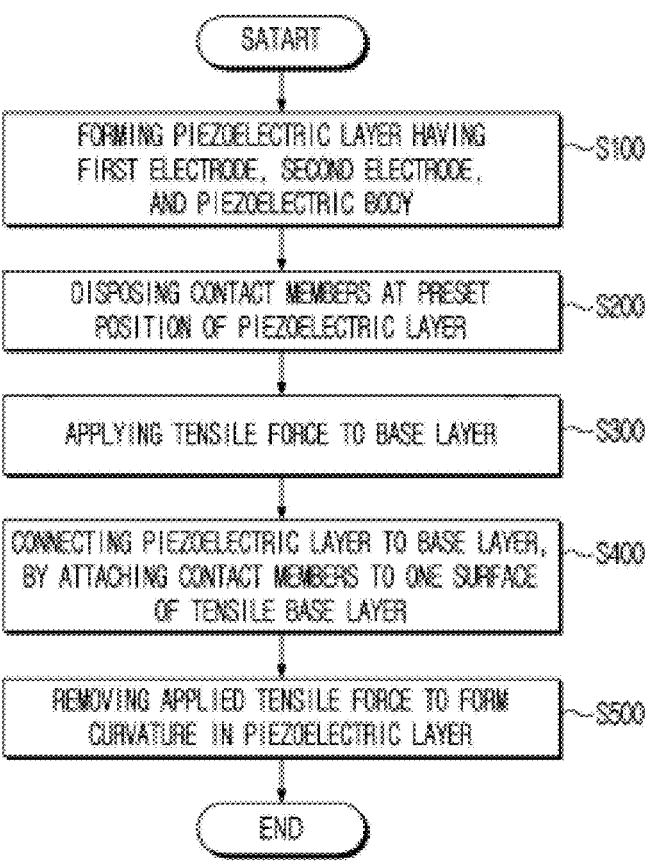
FIG. 6 is a diagram illustrating a method of manufacturing a piezoelectric element according to an embodiment of the disclosure.
Figure 7A:
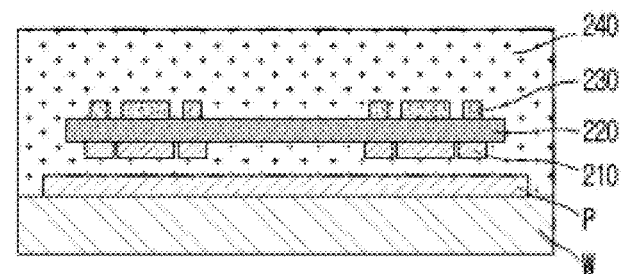
FIGS. 7A-7E are is a diagrams illustrating the manufacturing method of FIG. 6 according to an embodiment of the disclosure.
Figure 7B:
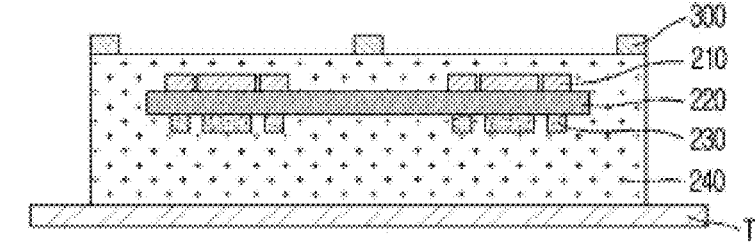
Figure 7C:
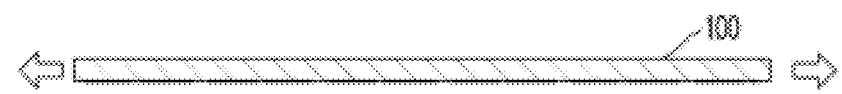
Figure 7D:
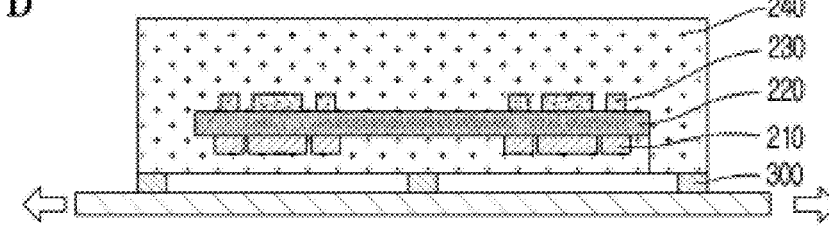
Figure 7E:
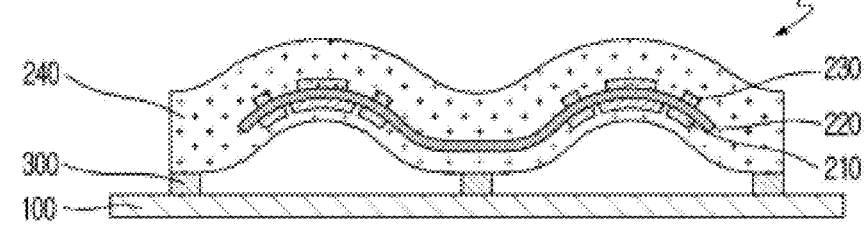
Figure 8:
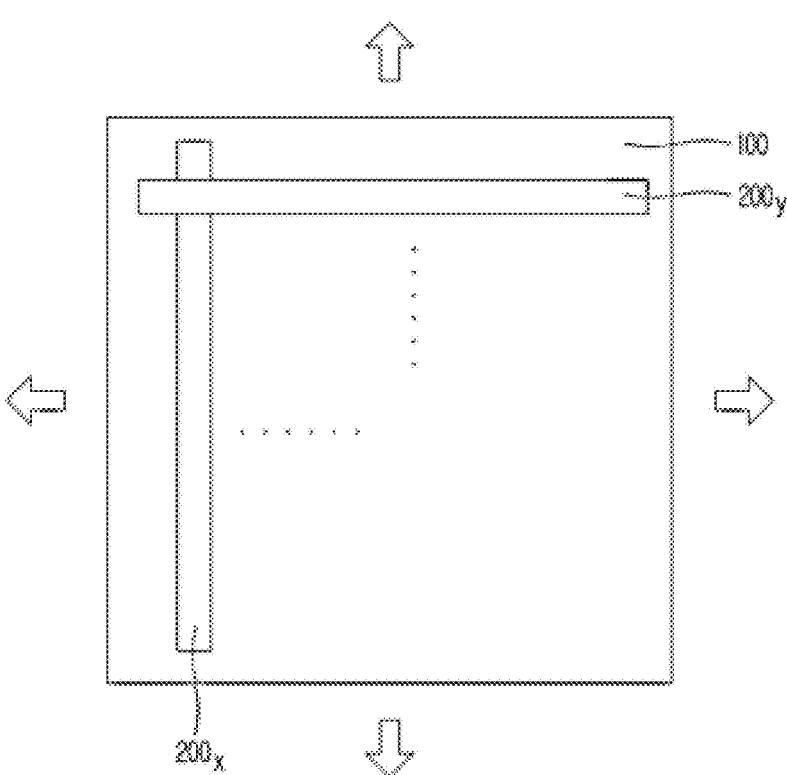
FIG. 8 is a diagram illustrating a method of manufacturing a piezoelectric element according to another embodiment of the disclosure.

FIG. 6 is a diagram illustrating a method of manufacturing a piezoelectric element according to an embodiment of the disclosure; FIGS. 7A-7E are diagrams sequentially illustrating the manufacturing method of FIG. 6 according to an embodiment of the disclosure; and FIG. 8 is a diagram illustrating a method of manufacturing a piezoelectric element according to another embodiment of the disclosure.

Referring to FIGS. 6 and 7, the piezoelectric element manufacturing method according to an embodiment of the disclosure may include forming the piezoelectric layer 200 having the first electrode 210, the second electrode 230 and the piezoelectric body 220 in operation S100, arranging the contact members 300 at a preset position of the piezoelectric layer 200 in operation S200, attaching the contact members 300 to the base layer 100 and forming the curvature in the piezoelectric layer 200.

The piezoelectric layer 200 having the first electrode 210, the second electrode 230, and the piezoelectric body 220 are formed in operation S100. The first electrode 210 may be disposed at the bottom, and then the piezoelectric body 220 may be disposed on the upper surface of the first electrode 210, and then the second electrode 230 may be disposed on the upper surface of the piezoelectric body 220 to form the piezoelectric layer 200. The first electrode 210 may be disposed on the upper surface of the polymer (P) laminated on the wafer (W). The wafer (W) and polymer (P) are not particularly limited, but in the present specification, a case where silicon wafers are used as wafer (W), and polymethylmethyleneplate (PMMA) is used as the polymer (P) will be described for convenience of description.

In another embodiment, the first electrode 210 may include a first(a) electrode terminal 211 and the first(b) electrode terminal 212 to be spaced apart from each other. The second electrode 230, when viewed from the plane, may include the second(a) electrode terminal 231 of which at least a part overlaps the first(a) electrode terminal 21 and the second(b) electrode terminal 232 of which at least a part overlaps the first(b) electrode terminal 212. In the area of the piezoelectric layer 200 in which the contact members 300 are disposed in operation S200 to dispose the contact members 300 described later, the piezoelectric layer 200 may be formed so that the first electrode 210 and the second electrode 230 are not disposed.

According to another embodiment, if the region of the piezoelectric layer 200 in which the contact members 300 is disposed is called the second region, and the region of the piezoelectric layer 200 between the second region is called the first region, the first(a) electrode terminal 211 may be disposed at the center of the first region, and the first(a) electrode terminal 211 may be spaced apart from the first(a) electrode terminal 211 on both sides of the first electrode terminal 211, to dispose the first(b) electrode terminal 212. Similarly, the second(a) electrode terminal 231 may be disposed at the center of the first region, and the second(b) electrode terminal 232 may be disposed on both sides of the second(a) electrode terminal 231 by being spaced apart from the second(a) electrode terminal 231. The first region may correspond to convex portions 200a, and the second region may correspond to concave portions 200b. The area between the first region and the second region, that is, the region in which the first(b) electrode terminal 212 and the second(b) electrode terminal 232 are disposed may correspond to the connection portion 200c.

In another embodiment, the step S100 of forming the piezoelectric layer 200 may include a process of laminating the protective layer 240. Specifically, as shown in FIG. 7A, it may be configured such that the protective layer 240 covers the piezoelectric layer 200 as a whole by disposing the first electrode 210 after laminating the protective layer 240 prior to disposing the first electrode 210, disposing the piezoelectric body 220 after laminating the protective layer 240 again, disposing the second electrode 230 after laminating the protective layer 240, and then laminating the protective layer 240 once again. Hereinafter, the piezoelectric layer 200 on which the protective layer 240 is formed will be described.

A transfer member T is attached to one surface of the piezoelectric layer 200 (one side of the protective layer 240) to separate the piezoelectric layer 200 from the wafer W. The transfer member T may be a water-soluble tape. In addition, the polymer P may be removed using acetone or the like, and a separation process may be performed.

Then, in the state where the piezoelectric layer 200 attached with the transfer member (T) is inverted, the contact members 300 are disposed at the preset position of the piezoelectric layer 200 in operation S200. Referring to FIG. 7E, the contact members 300 may be disposed in the area in which the concave portions 200b are formed in the piezoelectric layer 200. The Ti—SiO$_2$ may be used as the contact members 300, in which case the contact members 300 using a shadow mask (shadow mask) may be deposited at the preset position of the piezoelectric layer 200 using a shadow mask.

The tensile force is applied to the base layer 100 in operation S300. This is to apply the pre-strain to the base layer 100, and it is possible to apply the tensile force by pulling the base layer 100 using jig and the like.

By attaching the contact members 300 to one side of the sealed base layer 100, the piezoelectric layer 200 is connected to the base layer 100 in operation S400. Before attaching the contact members 300 to the base layer 100, it is possible to perform a UV ozone treatment (e.g., about five minutes) on one side of the base layer 100. After attaching the contact members 300 to the base layer 100, by heating the whole (e.g., heating for 30 minutes around 70° C.) the contact members 300 may be attached more solidly to the base layer 100 and piezoelectric layer 200.

By removing the applied tensile force to form a curvature in the piezoelectric layer 200 in operation S500. Referring to FIG. 7E, when removing the tensile force applied to the base layer 100 in the state of placing the piezoelectric layer 200 in the sealed base layer 100, the base layer 100 is to contract. Accordingly, the piezoelectric layer 200 connected to one side of the base layer 100 is also constricted, as shown in FIG. 7E, and the area between the contact members 300 is curved upwardly to form convex portions 200a. On the contrary, the area where the contact members 300 are formed to be curved downwardly to form concave portions 200b.

According to another embodiment, referring to FIG. 8, in the operation S300 of applying the tensile force to the base layer 100, tensile force may be applied in the first and second directions of the two different directions in the base layer 100. In the operation S400 of connecting the piezoelectric layer 200 to the base layer 100, the piezoelectric layer 200 may be disposed in the first direction to form the first piezoelectric layer 200x, and by placing the piezoelectric layer 200 in the second direction crossed with the first piezoelectric layer 200x to form a second piezoelectric layer 200y. In the operation S500 of forming a curvature in the piezoelectric layer 200, by removing the tensile force in the first and second directions applied to the base layer 100, it is possible to form a curvature in the first piezoelectric layer 200x and the second piezoelectric layer 200y.

According to another embodiment, referring to FIG. 8, in the operation S400 of connecting the piezoelectric layer 200 to the base layer 100 after applying the tensile force to the base layer 100 in the two different first direction and second direction, a plurality of first piezoelectric layer $200_k$ may be disposed in the first direction and a plurality of second piezoelectric layers $200_y$ may be disposed. In the forming a curvature in the piezoelectric layer 200 in operation S500, curvature may be formed in the first piezoelectric layer $200_k$ and the second piezoelectric layer $200_y$ by removing the tensile force applied in the first direction and the second direction. Accordingly, as illustrated in FIG. 5, the piezoelectric element 1 having a 3D net structure may be manufactured.

In the case of the related-art piezoelectric element having a two-dimensional structure, it has a flexible thin film form and is excellent in terms of the reliability of the element, but there is a problem that the element cannot be used under conditions where stretching is required. In the case of the related-art piezoelectric element having a three-dimensional structure, it is possible to stretch in one direction, but cannot stretch in two different directions, so there is a problem of lacking reproducibility and reliability in the formation of a three-dimensional structure with a constant wavelength and amplitude form.

The piezoelectric element and piezoelectric element manufacturing method according to the disclosure may increase the density of energy generated in the piezoelectric element by placing the piezoelectric layer having a three-dimensional structure in two different directions.

The piezoelectric element and piezoelectric element manufacturing method according to the disclosure may minimize the generated electrical energy from being offset by placing the electrode differently according to the curvature of the piezoelectric layer.

The piezoelectric element and piezoelectric element manufacturing method according to the disclosure has excellent reproducibility and reliability in forming a three-dimensional structure having a constant wavelength and amplitude form by forming the contact members at the reset position of the piezoelectric layer and the base layer.

The present specification is described mainly on a limited embodiment of the disclosure, but various embodiments are possible within the scope of the disclosure. Though not described, the equal means will also be combined as is in the disclosure. Therefore, the true scope of protection of the disclosure shall be determined by the claims below.

INDUSTRIAL APPLICABILITY

According to an embodiment, a piezoelectric element used in various industrial fields is provided.

What is claimed is:

1. A piezoelectric element comprising:
a base layer;
a piezoelectric layer which is disposed on one surface of the base layer, and in which upwardly curved convex portions and downwardly curved concave portions are continuously disposed along a first direction; and
contact members which are disposed on the concave portions of the piezoelectric layer and on the one surface of the base layer to connect the piezoelectric layer to the base layer,
wherein the piezoelectric layer comprises:
a first electrode disposed adjacent to the base layer, and having a first (a) electrode terminal and a first (b) electrode terminal spaced apart from each other;
a second electrode comprising a second (a) electrode terminal having a portion overlapping the first (a)

electrode terminal and a second (b) electrode terminal having a portion overlapping the first (b) electrode terminal; and
a piezoelectric body disposed between the first electrode and the second electrode,
wherein a gap between the first (a) electrode terminal and the first (b) electrode terminal is smaller than a gap between the second (a) electrode terminal and the second (b) electrode terminal.

2. The piezoelectric element of claim 1, wherein the first electrode includes the first (a) electrode terminal being disposed at an area corresponding to the convex portions and the first (b) electrode terminal being disposed at both ends of the first (a) electrode terminal.

3. The piezoelectric element of claim 2, wherein an area of the first (a) electrode terminal is greater than an area of the first (b) electrode terminal.

4. The piezoelectric element of claim 1, wherein the second electrode includes the second (a) electrode terminal being disposed at an area corresponding to the convex portions and the second (b) electrode terminal being disposed at both ends of the second (a) electrode terminal.

5. The piezoelectric element of claim 4, wherein an area of the second (a) electrode terminal is greater than an area of the second (b) electrode terminal.

6. The piezoelectric element of claim 1, wherein the piezoelectric element further comprises a cover member which covers at least a portion of the piezoelectric element and fluid is filled therein.

7. The piezoelectric element of claim 1, wherein the piezoelectric layer comprises:
a first piezoelectric layer disposed in the first direction; and
a second piezoelectric layer that is disposed in a second direction different from the first direction,
wherein convex portions of the second piezoelectric layer cross concave portions of the first piezoelectric layer.

8. The piezoelectric element of claim 7, wherein the piezoelectric element is stretchable or contractible in at least one of the first direction and the second direction.

9. The piezoelectric element of claim 7, wherein the contact members include first contact members to fix the concave portions of the first piezoelectric layer to the base layer and second contact members to fix the concave portions of the second piezoelectric layer to the base layer.

10. A piezoelectric element comprising:
a base layer;
a piezoelectric layer which is disposed on one surface of the base layer, and in which upwardly curved convex portions and downwardly curved concave portions are continuously disposed along a first direction; and
contact members which are disposed on the concave portions of the piezoelectric layer and on the one surface of the base layer to connect the piezoelectric layer to the base layer,
wherein the piezoelectric layer comprises:
a first electrode disposed adjacent to the base layer, and having a first (a) electrode terminal and a first (b) electrode terminal spaced apart from each other;
a second electrode comprising a second (a) electrode terminal having a portion overlapping the first (a) electrode terminal and a second (b) electrode terminal having a portion overlapping the first (b) electrode terminal; and
a piezoelectric body disposed between the first electrode and the second electrode, and wherein the first electrode and the second electrode are located at an area where the contact members are absent.

11. A manufacturing method of a piezoelectric element, the method comprising:

forming a piezoelectric layer having a first electrode, a second electrode, and a piezoelectric body;

disposing contact members at a preset position of the piezoelectric layer;

attaching the contact members to a base layer;

applying a tensile force to the base layer; and forming a curvature at the piezoelectric layer, wherein the forming the curvature in the piezoelectric layer comprises:

connecting the piezoelectric layer to the base layer by attaching the contact members to a surface of the base layer; and forming curvature in the piezoelectric layer by removing the tensile force applied to the base layer, wherein the first electrode comprises a first (a) electrode terminal and a first (b) electrode terminal spaced apart from each other, and the second electrode comprises a second (a) electrode terminal having a portion overlapping the first (a) electrode terminal and a second (b) electrode terminal having a portion overlapping the first (b) electrode terminal, and wherein the first electrode and the second electrode are located at an area where the contact members are absent.

12. The method of claim 11, wherein the forming curvature in the piezoelectric layer comprises forming an area between the contact members to be upwardly convex in the piezoelectric layer.

13. The method of claim 11, wherein the forming the piezoelectric layer comprises forming the first electrode terminal (a) at a center of a first region corresponding between the contact members, and disposing a first (b) electrode terminal at both sides of the first (a) electrode terminal to be spaced apart from the first (a) electrode terminal.

14. The method of claim 11, wherein the applying a tensile force to the base layer comprises applying the tensile force in a first direction and a second direction, wherein forming a curvature in the piezoelectric layer comprises:

disposing a first piezoelectric layer in the first direction and disposing a second piezoelectric layer in the second direction to be crossed with the first piezoelectric layer; and forming curvature in the first piezoelectric layer and the second piezoelectric layer by removing the tensile force applied in the first direction and the second direction.

15. The method of claim 11, further comprising:

covering at least a portion of the piezoelectric element with a cover member by filling a fluid inside the piezoelectric element.

\* \* \* \* \*